(12) United States Patent
Falster

(10) Patent No.: US 7,242,037 B2
(45) Date of Patent: Jul. 10, 2007

(54) PROCESS FOR MAKING NON-UNIFORM MINORITY CARRIER LIFETIME DISTRIBUTION IN HIGH PERFORMANCE SILICON POWER DEVICES

(75) Inventor: Robert J. Falster, London (GB)

(73) Assignee: MEMC Electronic Materials, Inc., St. Peters, MI (US)

(*) Notice: Subject to any disclaimer, the term of this patent is extended or adjusted under 35 U.S.C. 154(b) by 1 day.

(21) Appl. No.: 10/911,965

(22) Filed: Aug. 5, 2004

(65) Prior Publication Data
US 2005/0006796 A1 Jan. 13, 2005

Related U.S. Application Data

(62) Division of application No. 09/366,850, filed on Aug. 4, 1999, now Pat. No. 6,828,690.

(60) Provisional application No. 60/098,808, filed on Sep. 2, 1998, provisional application No. 60/095,407, filed on Aug. 5, 1998.

(51) Int. Cl.
*H01L 29/74* (2006.01)
*H01L 31/111* (2006.01)

(52) U.S. Cl. .............. 257/130; 257/131; 257/611; 257/612; 257/913; 257/E21.388

(58) Field of Classification Search .......... 257/130, 257/131, 611–612, 913; 438/471–477; 428/307.3, 428/312, 446, 450
See application file for complete search history.

(56) References Cited

U.S. PATENT DOCUMENTS

| | | |
|---|---|---|
| 3,860,947 A | 1/1975 | Gamo et al. |
| 3,943,549 A | 3/1976 | Jaecklin et al. |
| 4,259,683 A | 3/1981 | Adler et al. |
| 4,314,595 A | 2/1982 | Yamamoto et al. |
| 4,376,657 A | 3/1983 | Nagasawa et al. |
| 4,437,922 A | 3/1984 | Bischoff et al. |

(Continued)

FOREIGN PATENT DOCUMENTS

DE    43 23 964 A1    1/1994

(Continued)

OTHER PUBLICATIONS

Deng, B. et al.—"Uniformalization of the Pt-induced-trap concentration profile in silicon by the two-step diffusion method", Semicond. Sci Technol. 11 (1996) 535-537.
European Search Report for Application No. EP 04077447, dated Oct. 22, 2004, 4 pages.
Abe et al., "Innovated Silicon Crystal Growth andWafering Tecnologies", Electrochem. Soc. Proc., vol. 97, No. 3 (1997) pp. 123-133.
Abe et al., "Defect-Free Surfaces of Bulk Wafers by Combination of RTA and Crystal Growth Conditions", (publication information unknown).

(Continued)

*Primary Examiner*—Thien F Tran
(74) *Attorney, Agent, or Firm*—Senniger Powers

(57) ABSTRACT

An electronic power device comprising a single crystal silicon segment being characterized in that the segment comprises a non-uniform distribution of minority carrier recombination centers, the minority carrier recombination centers comprising a substitutional metal, with the concentration of the centers in a bulk layer being greater than the concentration in a surface layer. The centers have a concentration profile in which the peak density of the centers is at or near the central plane with the concentration generally decreasing from the position of peak density in the direction of the front surface of the segment and generally decreasing from the position of peak density in the direction of the back surface of the segment.

22 Claims, 8 Drawing Sheets

U.S. PATENT DOCUMENTS

| | | | |
|---|---|---|---|
| 4,505,759 | A | 3/1985 | O'Mara |
| 4,548,654 | A | 10/1985 | Tobin |
| 4,851,358 | A | 7/1989 | Huber |
| 4,868,133 | A | 9/1989 | Huber |
| 5,075,751 | A | 12/1991 | Tomii et al. |
| 5,327,007 | A | 7/1994 | Imura et al. |
| 5,401,669 | A | 3/1995 | Falster et al. |
| 5,403,406 | A | 4/1995 | Falster et al. |
| 5,445,975 | A | 8/1995 | Gardner et al. |
| 5,478,408 | A | 12/1995 | Mitani et al. |
| 5,502,010 | A | 3/1996 | Nadahara et al. |
| 5,502,331 | A | 3/1996 | Inoue et al. |
| 5,528,058 | A | 6/1996 | Pike, Jr. et al. |
| 5,534,294 | A | 7/1996 | Kubota et al. |
| 5,539,245 | A | 7/1996 | Imura et al. |
| 5,593,494 | A | 1/1997 | Falster |
| 5,611,855 | A | 3/1997 | Wijaranakula |
| 5,645,736 | A | 7/1997 | Allman |
| 5,674,756 | A | 10/1997 | Satoh et al. |
| 5,731,626 | A | 3/1998 | Eaglesham et al. |
| 5,738,942 | A | 4/1998 | Kubota et al. |
| 5,788,763 | A | 8/1998 | Hayashi et al. |
| 5,939,770 | A | 8/1999 | Kageyama |
| 5,944,889 | A | 8/1999 | Park et al. |
| 5,994,761 | A | 11/1999 | Falster et al. |
| 6,828,690 | B1 * | 12/2004 | Falster ................ 257/130 |

FOREIGN PATENT DOCUMENTS

| | | | |
|---|---|---|---|
| EP | 0 327 316 | A2 | 8/1989 |
| EP | 0 536 958 | A1 | 4/1993 |
| EP | 0 694 960 | A1 | 1/1996 |
| EP | 0 716 168 | A1 | 6/1996 |
| EP | 0 503 816 | B1 | 9/1996 |
| JP | 54055371 | | 5/1979 |
| JP | 1208830 | | 8/1989 |
| JP | 3-9078 | | 2/1991 |
| JP | 04125933 | | 4/1992 |
| JP | 5155700 | A | 6/1993 |
| JP | 7201874 | A | 8/1995 |
| JP | 7321120 | | 12/1995 |
| JP | 7335657 | | 12/1995 |
| JP | 8045944 | | 2/1996 |
| JP | 8045945 | | 2/1996 |
| JP | 8045947 | | 2/1996 |
| JP | 9199416 | | 7/1997 |
| JP | 11067781 | | 3/1999 |
| JP | 11150119 | A | 6/1999 |
| WO | WO 98/38675 | | 9/1998 |
| WO | WO 98/45507 | | 10/1998 |

OTHER PUBLICATIONS

European Examination Report for European Patent Application No. 999420128, dated Feb. 16, 2004, 4 pgs.

Falster et al., "The Engineering of Silicon Wafer Material Properties Through Vacancy Concentration Profile Control and the Achievement of Ideal Oxygen Precipitation Behavior", Mat. Res. Soc. Symp. Proc., vol. 510, pp. 27-35, 1998.

Hara et al., "Enhancement of Oxygen Precipitation in Quenched Czochralski Silicon Crystals", J. Appl. Phys., vol. 66, No. 8 (1989) pp. 3958-3960.

Hawkins et al., "Effect of Rapid Thermal Processing on Oxygen Precipitation in Silicon", Mat. Res. Soc. Symp. Proc., vol. 104, pp. 197-2000, 1988.

Hawkins et al., "The Effect of Rapid Thermal Annealing on the Precipitation of Oxygen in Silicon", J. Appl. Phys., vol. 65, No. 9, pp. 3644-3654, 1989.

Hemg-Der Chiou, "The Effects of Preheatings on Axial Oxygen Precipiation Uniformity in Czochralski Silicon Crystals", J. Electrochem Soc., vol. 139, No. 6, Jun., 1992.

Jacob et al., "Determination of Vacancy Concentrations in the Bulk of Silicon Wafers by Platinum Diffusion Experiments", J. Appl. Phys., vol. 82, No. 1 (1997) pp. 182-191.

Jacob et al., "Influence of RTP on Vacancy Concentrations", Mat. Res. Soc. Symp Proc. vol. 490, pp. 129-134, 1998.

Nadahara et al., "Hydrogen Annealed Silicon Wafer", Solid State Phenomena, vols. 57-58, pp. 19-26 (1997).

Pagani et al. "Spatial Variations in Oxygen Precipitation in Silicon after High Temperature Rapid Thermal Annealing", Appl. Phys. Lett., vol. 79, No. 12, pp. 1572-1574, 1997.

Shimura, "Semiconductor Silicon Crystal Technology", Academic Press, Inc., San Diego CA (1989) pp. 360-377.

Temple et al., "Optimizing Carrier Lifetime Profile for Improved Trade-off Between Turn-off Time and Forward Drop", IEEE Transactions on Electron Devices, vol. ED-30, No. 7 (1983) pp. 782-790.

Winkler et al., "Improvement of the Gate Oxide Integrity by Modifying Crystal Pulling and Its Impact on Device Failures", J. Electrochem. Soc., vol. 141, No. 5 (1994) pp. 1398-1401.

Zimmermann et al., "Gold and Platinum Diffusion: the Key to the Understanding of Intrinsic Point Defect Behavior in Silicon", Applied Physics A Solids and Surfaces. vol. A55, No. 1 (1992) pp. 121-eoa.

Zimmermann et al., "Investigation of the Nucleation of Oxygen Precipitates in Czochralski Silicon at an Early Stage", Appl. Phys. Lett., vol. 60, No. 26 (1992) pp. 3250-3253.

Zimmermann et al., "The Modeling of Platinum Diffusion in Silicon Under Non-equilibrium Conditions", J. Electrochem. Soc., vol. 139, No. 1 (1992) pp. 253-262.

Zimmermann et al., "Vacancy Concentration Wafer Mapping in Silicon", Journal of Crystal growth, vol. 129, Nos. 3/4 (1993) pp. 582-592.

Zimmermann, H.;Ryssel, H., "Observation of Inverse U-Shaped Profiles After Platinum Diffusion in Silicon," Appl. Phys. Lett., 1991, pp. 1209-1211, vol. 59, No. 10.

Abe et al., "Defect-Free Surfaces of Bulk Wafers by Combination of RTA and Crystal Growth Conditions", 31st Symposium on ULSI Ultra Clean Technology, Dec. 18-19, 1997, 11 pp., Tokyo Japan.

* cited by examiner

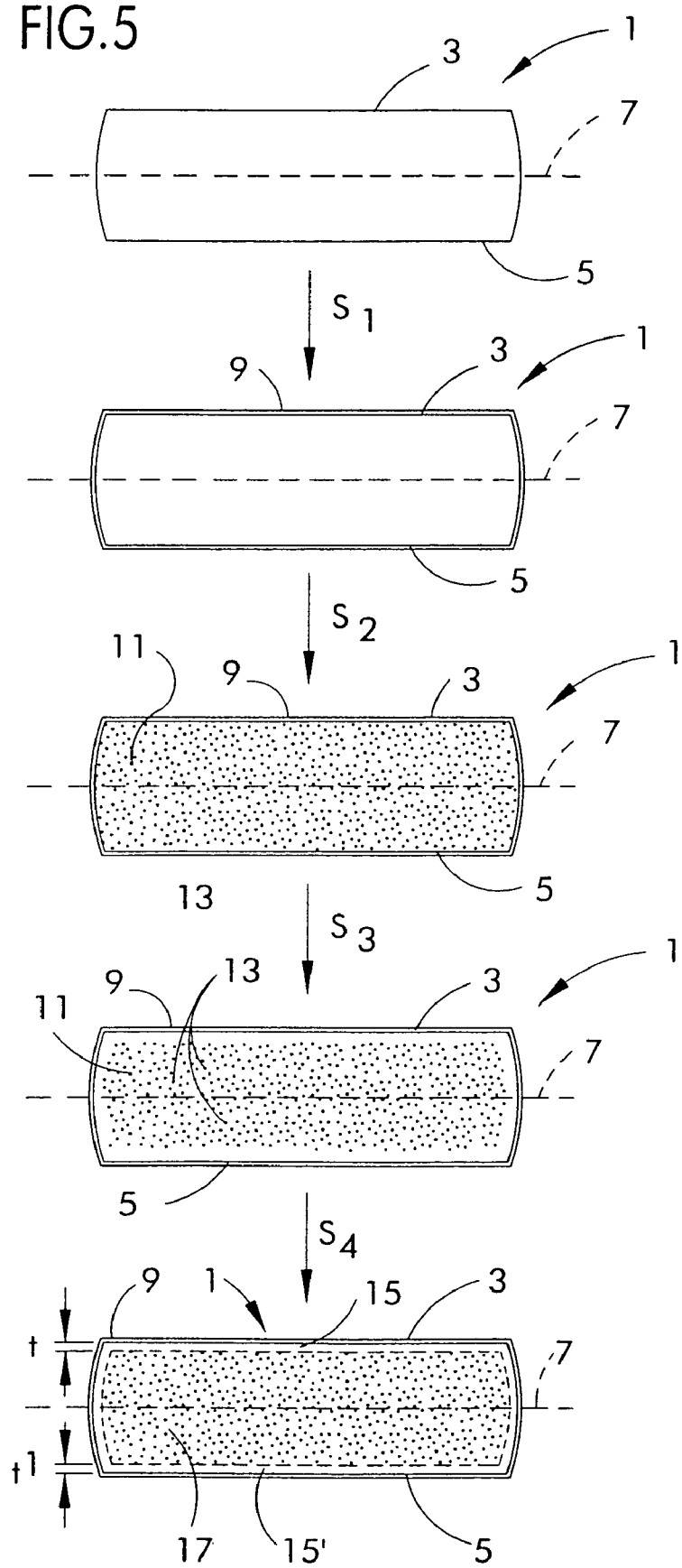

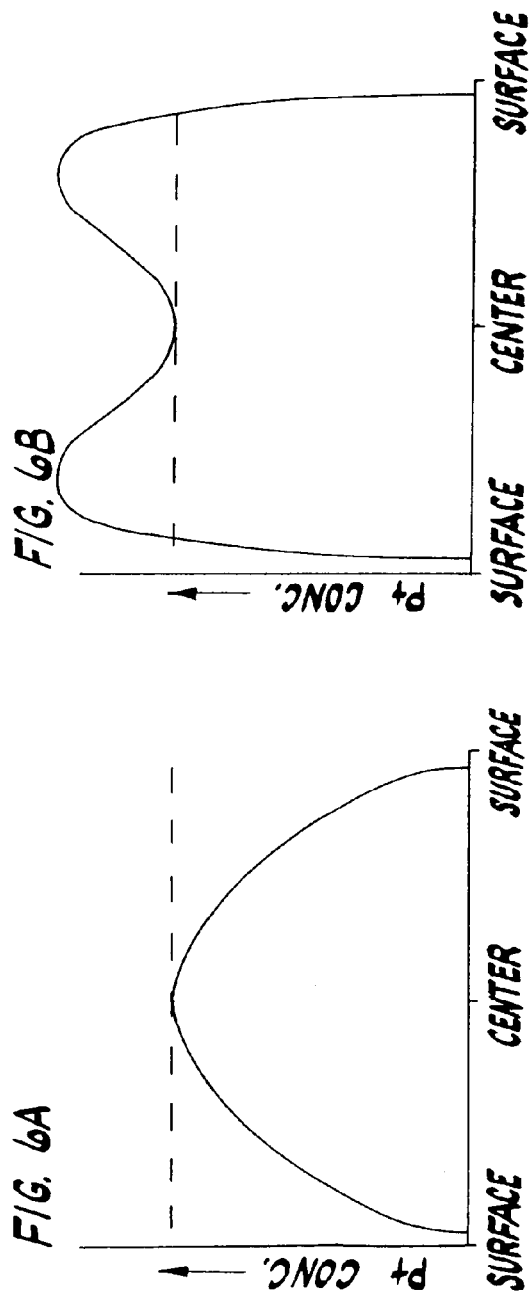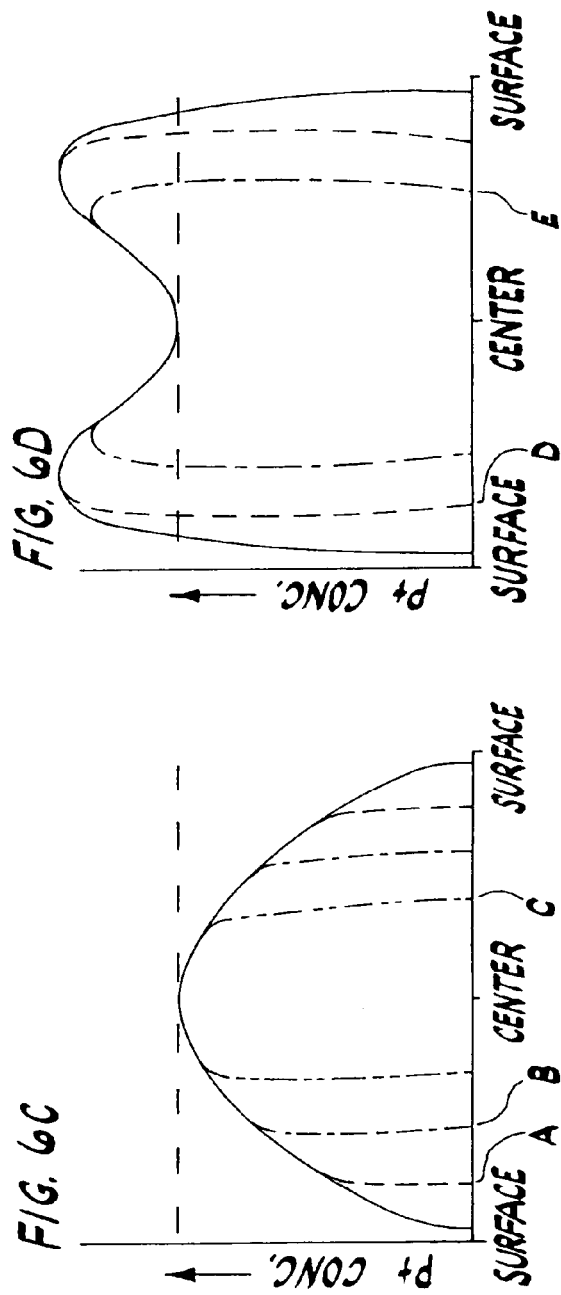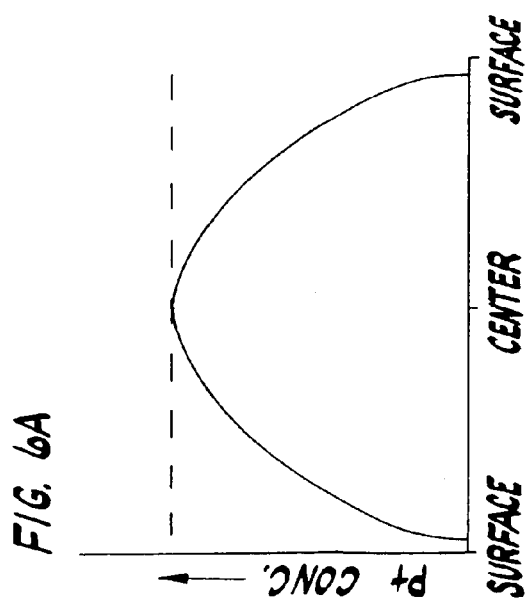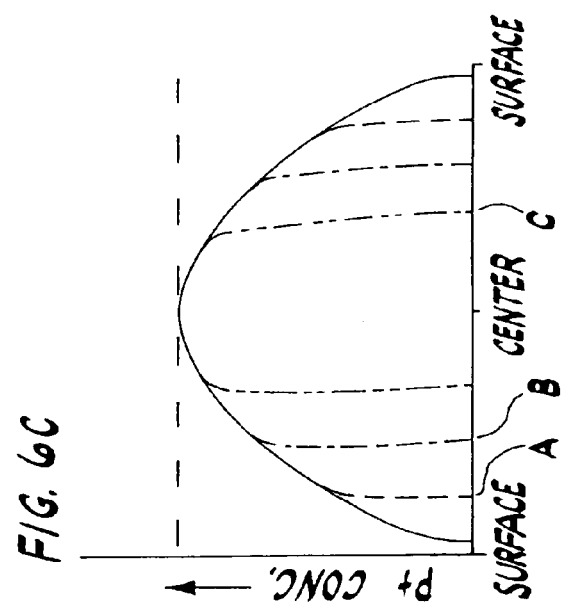

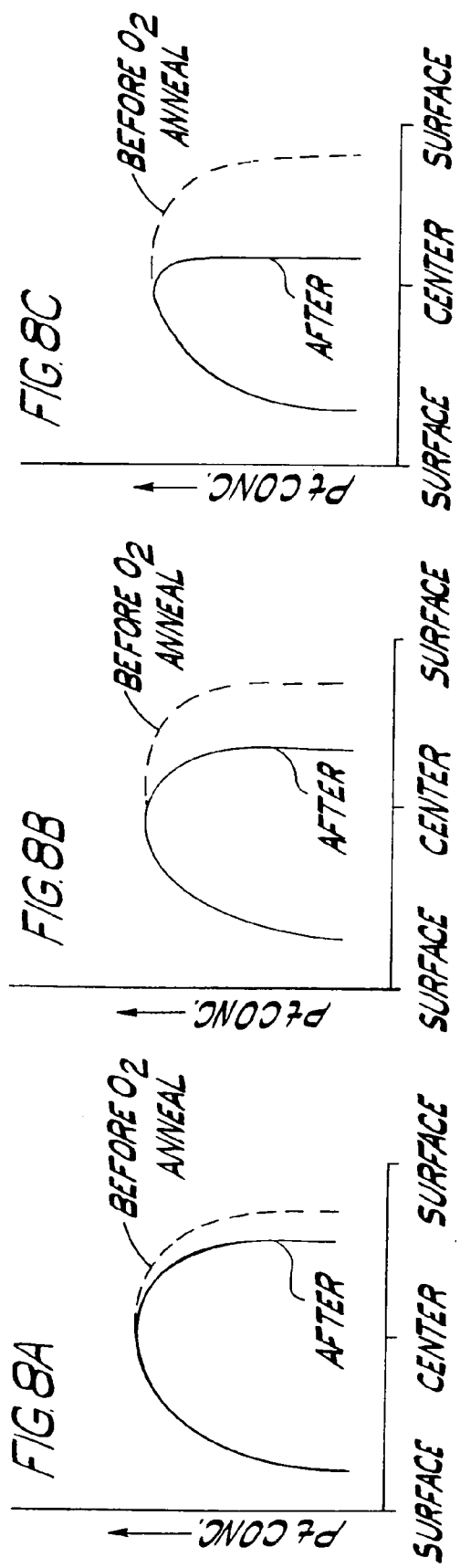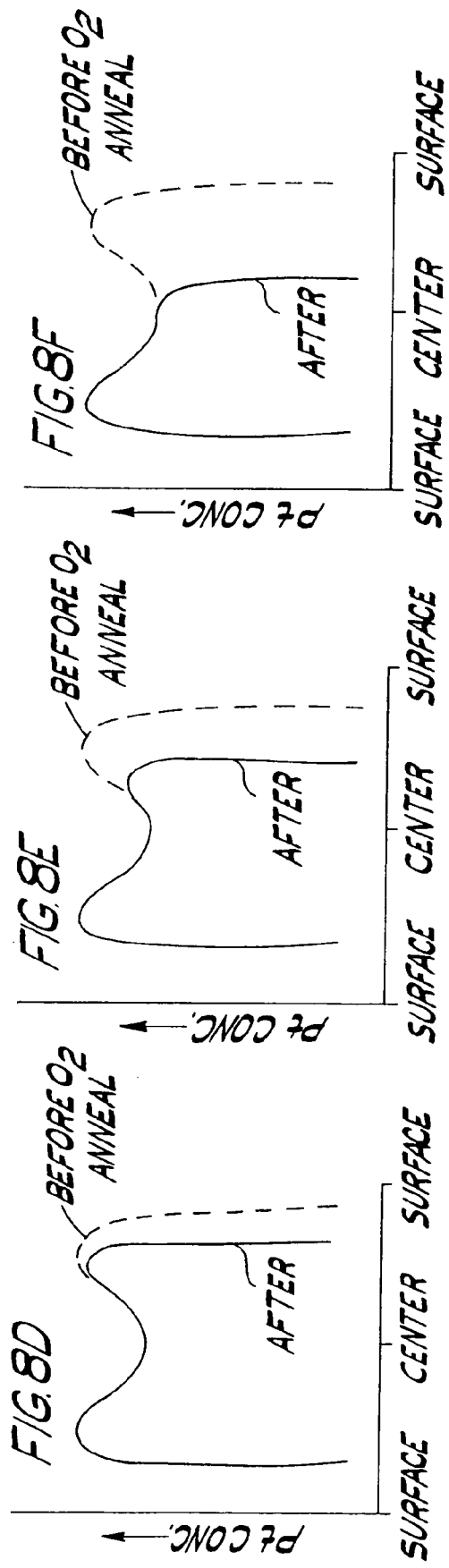

PROCESS FOR MAKING NON-UNIFORM MINORITY CARRIER LIFETIME DISTRIBUTION IN HIGH PERFORMANCE SILICON POWER DEVICES

CROSS-REFERENCE TO RELATED APPLICATION

This divisional patent application claims priority from U.S. patent application Ser. No. 09/366,850 filed Aug. 4, 1999 now U.S. Pat. No. 6,828,690, the entirety of which is hereby incorporated by reference.

REFERENCE TO RELATED APPLICATION

This application claims priority from U.S. provisional application Ser. No. 60/095,407, filed on Aug. 5, 1998 and U.S. provisional application Ser. No. 60/098,808, filed on Sep. 2, 1998.

BACKGROUND OF THE INVENTION

The present invention generally relates to a process for the preparation of high performance silicon power devices having improved turn-off or switching time, as well as forward voltage drop. More specifically, the process of the present invention relates to the preparation of a silicon segment containing regions having different minority carrier lifetimes by means of controlling the concentration profile of recombination centers within the silicon segment.

For designers of certain types of solid state power devices, such as thyristors or power diodes, both the switching speed and turn-off charge are important considerations. As the switching speed increases and the turn-off charge decreases, the more efficient the device becomes. Unfortunately, however, conventional methods of increasing the switching speed of a particular device often result in an appreciable increase in turn-off charge, or forward voltage drop, which acts to hinder device efficiency.

Typically, in the "on" state, power devices are flooded with excess carriers which are responsible for carrying the large current that is required. Problems arise with such devices, however, when the devices are switched off; more specifically, problems arise with how to get rid of these carriers when they are no longer needed. Minority carrier recombination has been identified as one of the major mechanisms by which these excess carriers may be dissipated. The faster recombination occurs, the faster a power device can be depleted of carriers when switched off and, therefore, the faster the device actually switches off. However, if the recombination rate is high throughout the bulk of the device, then a higher voltage is required to support the current when the device is on. As a result, the power consumption of the device is increased and, accordingly, the efficiency of the device is decreased. Therefore, any improvement in the switching speed of the device is achieved at the cost of decreased device efficiency.

It is known in the art that doping semiconductor devices with lifetime killing impurities (i.e., recombination centers such as gold or platinum) result in an increase in the recombination rate when the device is turned off, and thus an increase in the switching speed as well. (See, e.g., V. Temple and F. Holroyd, "Optimizing Carrier Lifetime Profile for Improved Trade-off Between Turn-off Time and Forward Drop," *IEEE Transactions on Electron Devices*, ed. 23, pp. 783–790 (1983).) In the past, such impurity doping has typically been applied to large areas of the device, even throughout the entire bulk of the device. This approach has resulted in significant decreases in the device turn-off time. However, accompanied with this improvement is an increase in device forward voltage drop. Similar results have been obtained when alternative methods of "lifetime killing" have been employed, including electron, proton and gamma radiation, throughout the bulk of the device.

In an attempt to avoid the problems associated with bulk doping or bulk treatment of the device, local lifetime killing has been proposed. (See, e.g., Temple et al., *IEEE Transactions on Electron Devices*, pp. 783–790.) For example, local regions of a thyristor have been selectively irradiated, or doped with gold, in an attempt to control the location of the minority carrier recombination centers, and thus decrease the minority carrier recombination lifetime within a specific region of the device. Such approaches are attractive because, in theory at least, they allow for a region to be selectively doped with recombination centers, thus improving the switching speed within this region, while leaving the bulk of the device undoped, and thus prevent the large forward voltage drop associated with bulk doping or treatment of the device.

Previously, optimizing the spatial location of these recombination centers within the bulk of the device has been considered. For example, as illustrated in FIG. 1A and FIG. 1B, Temple et al. demonstrated the desirability of having a region of enhanced recombination (i.e., short minority carrier lifetime) within the device in a plane which is perpendicular to the direction of the on-state current flow. However, the practical problem of how to selectively tailor or control the location of dopants within the device has to date proven difficult. In fact, Temple et al. state that the local tailoring of such a region within a device would not be easily achievable experimentally, and that any practical applications would involve an extensive development program with an unknown chance of success.

Accordingly, a need continues to exist for a process whereby the concentration of minority carrier recombination centers within a device may be selectively profiled or tailored such that these centers may be primarily located within a specific region, with the remainder of the device being substantially free of such centers.

SUMMARY OF THE INVENTION

Among the objects of the invention, therefore, is the provision of a single crystal silicon segment suitable for use in the fabrication of a solid state power device having increased switching speed without the attendant increase in forward voltage drop; the provision of such a silicon segment which contains a non-uniform depth distribution of minority carrier recombination centers; the provision of such a segment which contains a region having an improved minority carrier recombination rate; the provision of a process for manufacturing such a silicon segment in which the segment undergoes an initial thermal treatment in order to profile the vacancy concentration therein; and, the provision of such a process in which interstitial platinum atoms are in-diffused into the silicon segment under conditions which result in a platinum concentration profile generally corresponding to the vacancy concentration profile.

Briefly, therefore, the present invention is directed to a single crystal silicon segment having two major, generally parallel surfaces, one of which is the front surface of the segment and the other of which is the back surface of the segment, a central plane between the front and back surfaces, a circumferential edge joining the front and back surfaces, a surface layer which comprises the region of the segment below the front surface and a distance, $D_1$, as measured from the front surface and toward the central plane, and a bulk layer which comprises a second region of the segment between the central plane and the first region. The segment is characterized in that it has a non-uniform distribution of minority carrier recombination centers, with the concentration of the centers in the bulk layer being greater than the concentration in the surface layer and with the centers having a concentration profile in which the peak density of the centers is at or near the central plane with the concentration generally decreasing from the position of peak density in the direction of the front surface of the segment.

The present invention is further directed to a single crystal silicon segment having two major, generally parallel surfaces, one of which is the front surface of the segment and the other of which is the back surface of the segment, and a central plane between the front and back surfaces. The segment is characterized in that it has a non-uniform distribution of minority carrier recombination centers between the front and back surfaces, wherein a maximum concentration of the recombination centers is in a region which is between the front surface and the central plane and nearer to the front surface than the central plane, the concentration of the recombination centers increases from the front surface to the region of maximum concentration and decreases from the region of maximum concentration to the central plane.

The present invention is further directed to a process for heat-treating a single crystal silicon segment to influence the concentration profile of minority carrier recombination centers in the segment. The silicon segment has a front surface, a back surface, a central plane between the front and back surfaces, a surface layer which comprises the region of the segment between the front surface and a distance, D, measured from the front surface and toward the central plane, and a bulk layer which comprises the region of the segment between the central plane and surface layer. The process comprises heat-treating the segment in an atmosphere to form crystal lattice vacancies in the surface and bulk layers, controlling the cooling rate of the heat-treated segment to produce a segment having a vacancy concentration profile in which the peak density is at or near the central plane with the concentration generally decreasing in the direction of the front surface of the segment, and thermally diffusing platinum atoms into the silicon matrix of the cooled segment such that a platinum concentration profile results which is substantially dependant upon the vacancy concentration profile.

The present invention is still further directed to a process for heat-treating a single crystal silicon segment to influence the concentration profile of minority carrier recombination centers in the segment. The silicon segment has a front surface and a back surface, the front surface having only a native oxide layer present thereon, and a central plane between the front and back surfaces. The process comprises heat-treating the front surface of the segment in a nitriding atmosphere to form crystal lattice vacancies in the segment, and then controlling the cooling rate of the heat-treated segment to produce a vacancy concentration profile in the cooled segment in which a maximum concentration is between the front surface and the central plane and nearer to the front surface than the central plane, the vacancy concentration generally increasing from the front surface to the region of maximum concentration and generally decreasing from the region of maximum concentration to the central plane. Platinum atoms are then thermally diffused into the silicon matrix of the cooled segment such that a platinum concentration profile results which is substantially dependant upon the vacancy concentration profile.

Other objects and features of this invention will be in part apparent and in part pointed out hereinafter.

BRIEF DESCRIPTION OF THE DRAWINGS

FIG. 5 is a schematic depiction of the process of the present invention.

FIGS. 6A through 6D are plots generally depicting the platinum concentration relative to the depth of the silicon segment (extending from one surface to the other, but excluding the surfaces themselves), showing in detail the various platinum concentration profiles which may be achieved as a result of the different embodiments of the process of the present invention.

FIGS. 8A through 8F are plots generally depicting the platinum concentration relative to the depth of the silicon segment (extending from one surface to the other, but excluding the surfaces themselves), showing in detail the various asymmetric platinum concentration profiles which may be achieved as a result of the different embodiments of the process of the present invention.

DETAILED DESCRIPTION OF THE PREFERRED EMBODIMENTS

Figure 1A:
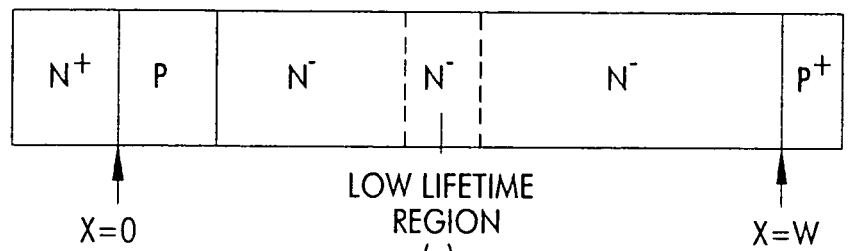
FIG. 1A is a schematic diagram of a thyristor structure containing a single low lifetime region; that is, a region having a higher concentration of minority carrier recombination centers relative to the other regions of the thyristor structure.

In accordance with the process of the present invention, a silicon segment suitable for use in the preparation of electronic power devices, such as thyristors and power diodes, may be prepared to contain a peak concentration of recombination centers within a specific region, or regions, of the segment, while the remainder of the silicon segment contains a concentration of recombination centers which is comparatively lower. The present invention is further characterized by the fact that platinum atoms which are diffused into the silicon matrix assume a concentration profile that substantially corresponds to the vacancy concentration profile, thus establishing a recombination center concentration profile throughout the silicon segment.

Without being held to any particular theory, it is generally believed that, to a first order, the minority carrier recombination lifetime is inversely proportional to the concentration of silicon lattice defects which create discreet energy levels in the bandgap of a semiconductor. These levels offer an energetic "stepping stone" for recombination of an excess carrier across the band gap, thus increasing the rate at which this occurs. The typical parameter which is used to characterize this rate is the minority carrier recombination lifetime, $\tau$. The basic minority carrier lifetime of a semiconductor $\tau_0$ may be expressed by Equation (1):

$$\tau_0 = (V_{th} \sigma N_T)^{-1} \qquad (1)$$

where $V_{th}$ is the thermal velocity of the minority carrier;

$\sigma$ is the capture cross section of the recombination center for the minority carrier; and, $N_T$ is the density of the recombination centers.

For a given semiconductor, the only adjustable parameter in the minority carrier lifetime equation is the recombination center density, or concentration. Therefore, to achieve the lifetime profile as suggested by FIG. 1B (where N is the number of carriers present, N is the average carrier concentration on the on state, and N/N is the normalized concentration thereof), a layer of material is required somewhere between the two surfaces of the silicon segment with a higher concentration of recombination centers than in both of the surface regions. A desired concentration profile for these recombination centers is schematically illustrated in FIG. 2.

Recombination centers may be introduced into a semiconductor by a number of means, the most common of which being the diffusion of a foreign element, typically a metal, into the silicon material. In recent years, much has been learned about the diffusion and incorporation mechanism of platinum, a recombination center, in silicon power device technology. Experience to date suggests platinum is not incorporated into silicon by the typical substitutional or interstitial diffusion mechanisms, as is the case for boron and iron, respectively. Rather, platinum is believed to be incorporated through one of two possible mechanisms whereby a fast diffusing, low solubility interstitial metal species is transformed into a slow diffusing, high solubility substitutional species by interacting with intrinsic point defects, i.e., crystal lattice vacancies and silicon self-interstitials. For purposes of recombination, or minority carrier lifetime, it is the resulting concentration of the substitutional species, i.e., platinum, which is important to the present invention.

The first mechanism through which a platinum atom and an intrinsic point defect may interact involves the combination of an interstitial platinum atom with a vacancy to produce a substitutional platinum atom. This mechanism is typically referred to as the "Frank-Turnbull" (i.e., "F-T") mechanism, and may be expressed by Equation (2):

$$V + M_i \leftrightarrows M_s \qquad (2)$$

where

V is a silicon lattice vacancy;

$M_i$ is an interstitial platinum atom; and, $M_s$ is a substitutional platinum atom.

The second mechanism occurs when an interstitial platinum atom "kicks" a silicon atom out of its lattice site and into an interstitial site. This mechanism, i.e., the "kick-out" mechanism, may be expressed by Equation (3):

$$M_i \leftrightarrows M_s + I \qquad (3)$$

where

I is a silicon self-interstitial atom;

$M_i$ is an interstitial platinum atom; and, $M_s$ is a substitutional platinum atom.

Figure 3:
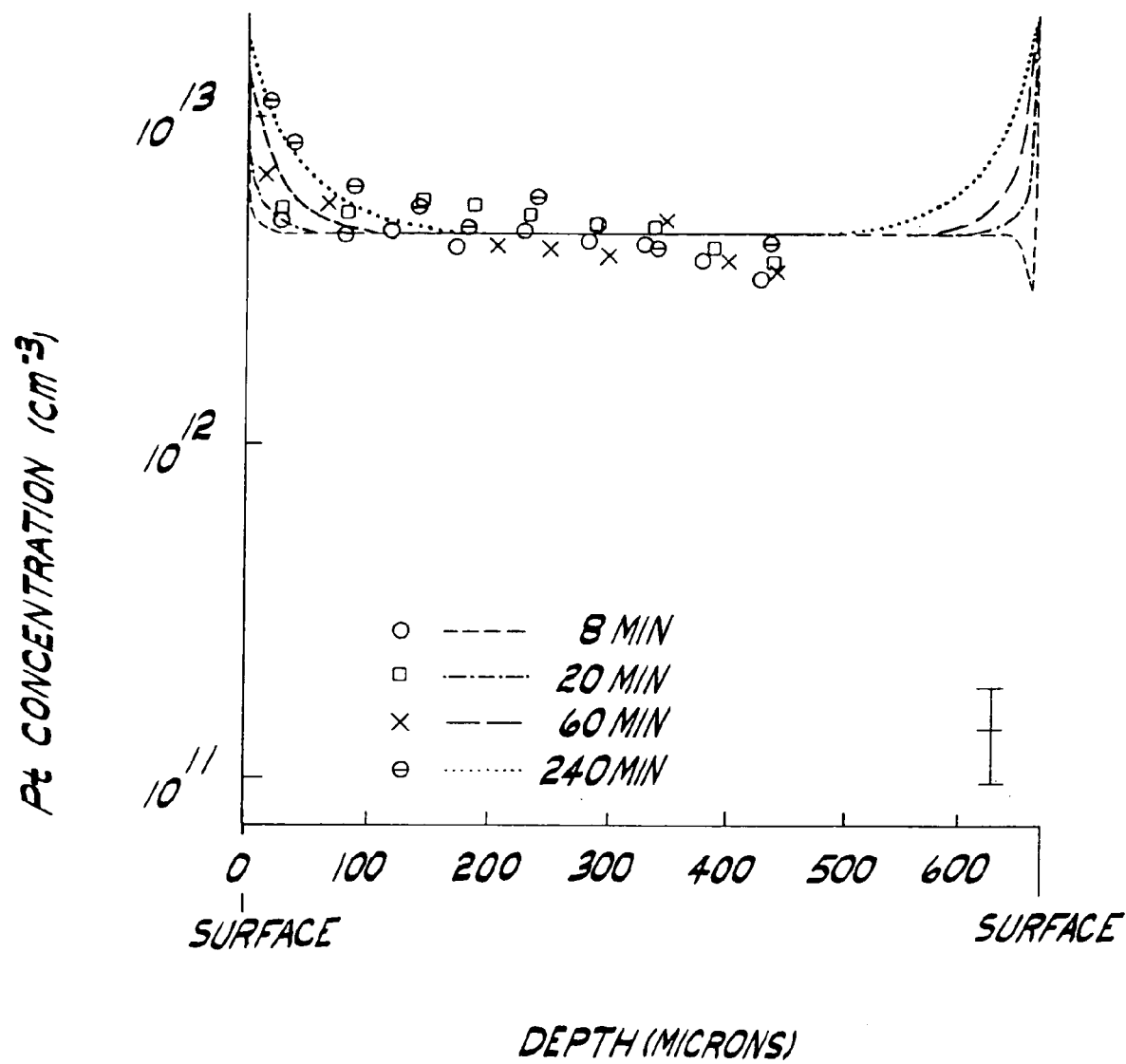
FIG. 3 is a plot of the platinum concentration versus the depth of the silicon segment (extending from one surface to the other, but excluding the surfaces themselves), showing in detail the platinum concentration profile as a function of treatment time when the Frank-Turnbull diffusion mechanism is dominant and the vacancy concentration profile is generally uniform.

For a given attempt to in-diffuse platinum, which mechanism will dominate depends, at least in part, on the diffusion time and temperature, and the concentration of vacancies and self-interstitials present in the sample. If the F-T mechanism dominates, then a platinum concentration profile such as that depicted by FIG. 3 may be formed or created in the silicon segment. It may be observed from Equation (2) that if the F-T mechanism is followed, the platinum concentration reached in the center of the sample is about equal to the vacancy concentration at the center. This relationship may be expressed by Equation (4) as:

$$C_m = C_v / (1 + C^{eq}_v / C^{eq}_m) \qquad (4)$$

where $C_m$ and $C_v$ are the concentrations of metal atoms and vacancies, respectively; and, $C^{eq}_v$ and $C^{eq}_m$ are the equilibrium values of the vacancy and metal concentrations at the diffusion temperatures, respectively.

Typically, $C^{eq}_v$ is much greater than $C^{eq}_m$ and, therefore, $C_m \approx C_v$ (i.e., $C_m$ is about equal to $C_v$). As a result, when the F-T mechanism is followed, interstitial platinum atoms which are in-diffused fill the existing vacancies in the sample and become substitutional in the process.

Referring again to FIG. 3, it can be seen that the interaction between interstitial platinum atoms and vacancies to produce substitutional platinum occurs rapidly; that is, as can be seen from FIG. 3, transport of interstitial platinum atoms is sufficiently fast such that this interaction is essentially time independent. Furthermore, it is to be noted from FIG. 3 that while $C_m \approx C_v$ in the bulk of the silicon segment, there is some deviation from $C_m \approx C_v$ in regions of the silicon segment near the segment surfaces.

Figure 1B:
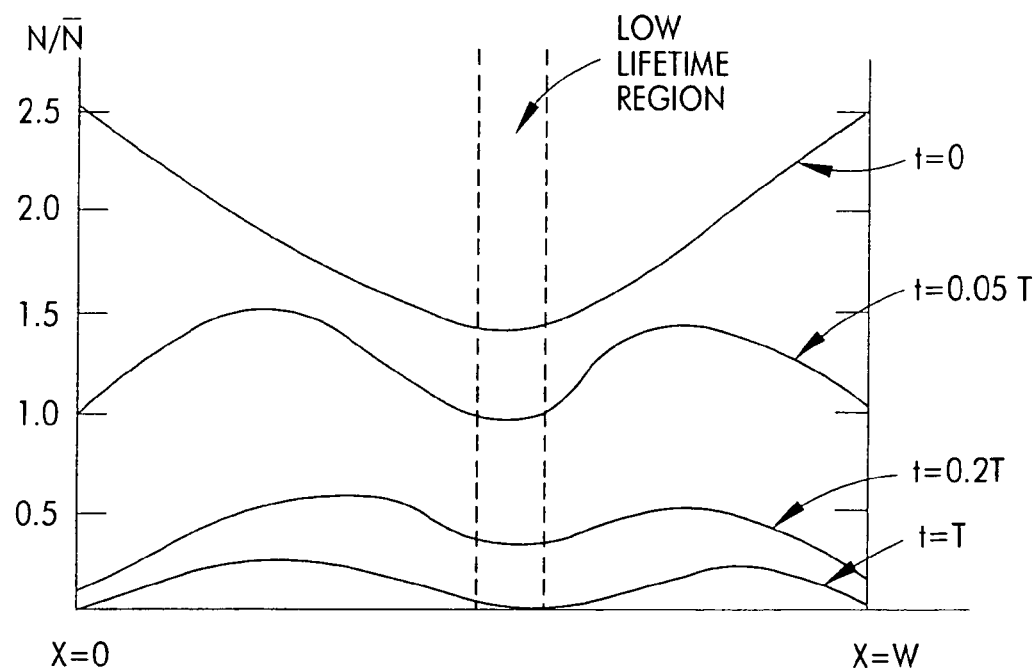
FIG. 1B is a plot of a preferred concentration profile of minority carrier recombination centers (i.e., a minority carrier lifetime profile) in the thyristor structure of FIG. 1A, during turn off.
Figure 2:
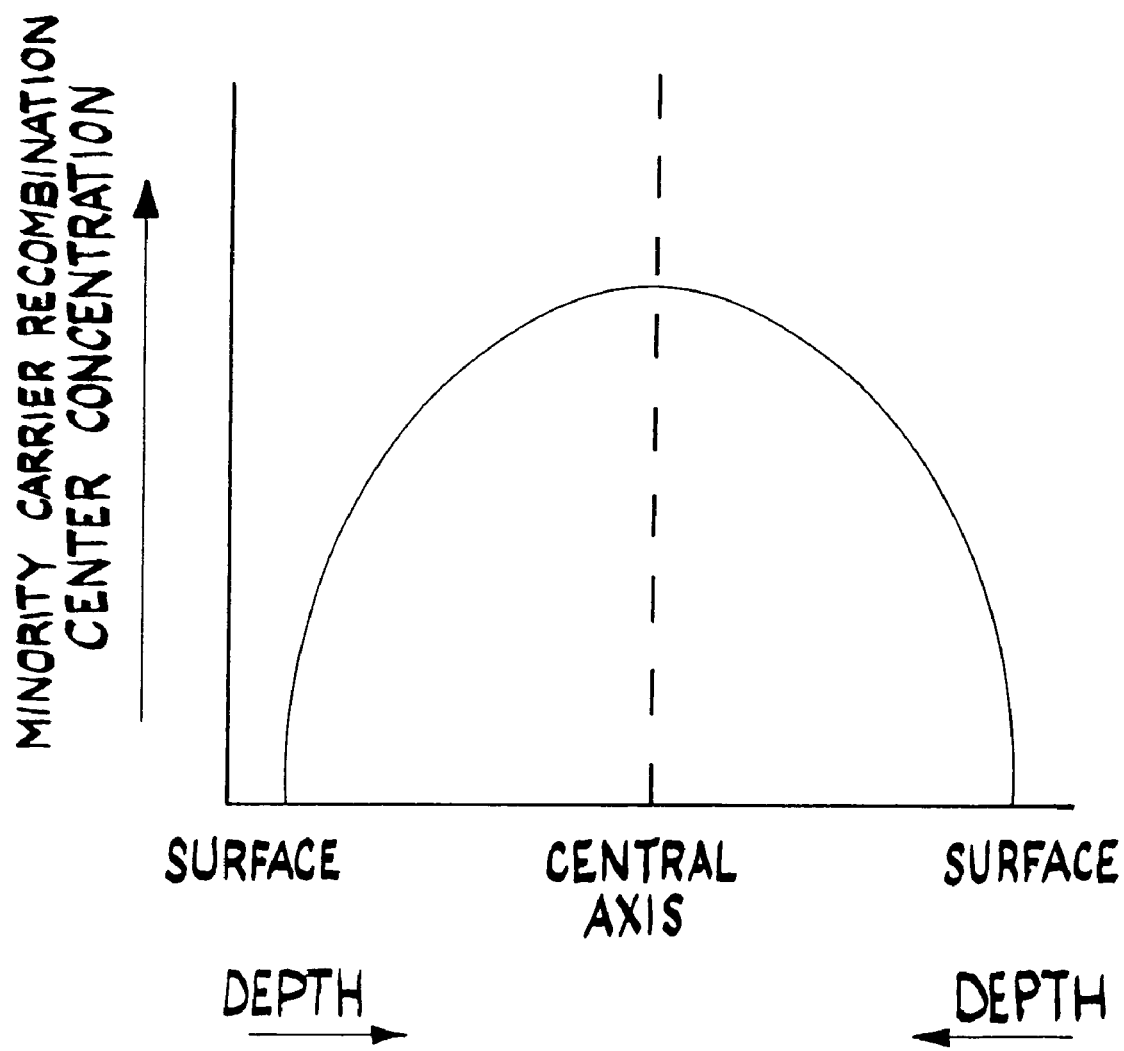
FIG. 2 is a plot generally depicting the minority carrier recombination center concentration relative to the depth of a silicon segment (extending from one surface of the segment to the other, but excluding the surfaces themselves), in accordance with the present process.
Figure 4:
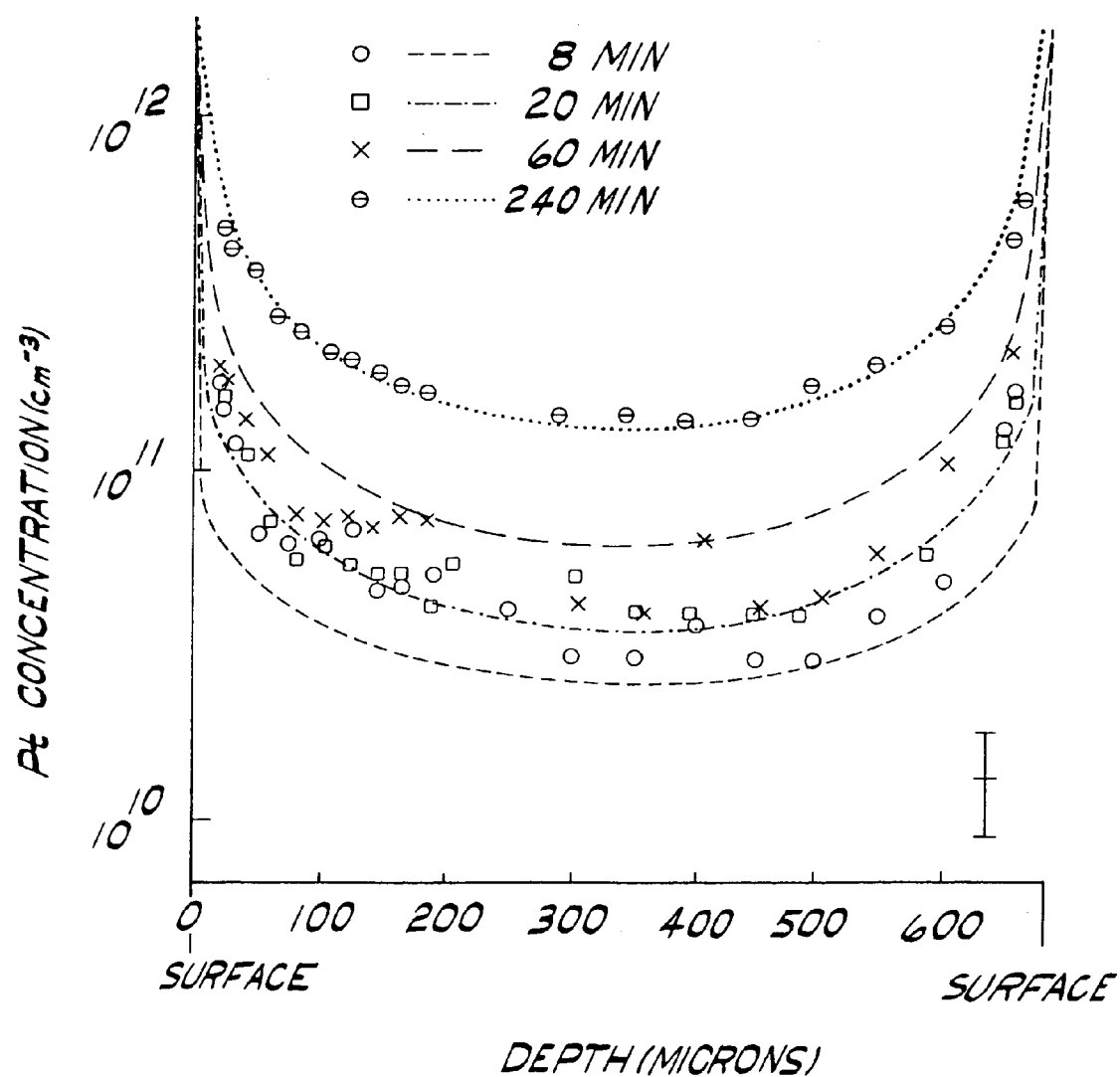
FIG. 4 is a plot of the platinum concentration versus the depth of the silicon segment (extending from one surface to the other, but excluding the surfaces themselves), showing in detail the platinum concentration profile as a function of treatment time when the "kick-out" mechanism is dominant and the vacancy concentration profile is generally uniform.

Referring now to FIG. 4, it can be seen that if the results of the kick-out mechanism (FIG. 4) and the F-T mechanism (FIG. 3) are compared, the F-T mechanism provides a more uniform depth distribution of recombination centers, from the perspective of the desired concentration profile shown in FIG. 1B. However, it is the fact that platinum atoms incorporated by the F-T mechanism appear to be closely related to the vacancy concentration profile which is the focus of the present invention. If the vacancy concentration profile of the silicon material can be controlled, then the concentration profile of platinum in the device may also be controlled, provided in-diffusion of the platinum atoms follows the F-T mechanism.

Accordingly, the process of the present invention affords the means by which to reproducibly control the concentration profile of recombination centers in the silicon material by advantageously controlling the vacancy concentration profile. More specifically, by controlling the vacancy concentration profile within the silicon material and the conditions under which platinum is in-diffused into the material, such that the F-T mechanism is followed, recombination centers may be incorporated within the material at a desired depth distribution and thereby provide optimum device performance.

The starting material for the process of the present invention is typically a segment of single crystal silicon which has been sliced from a single crystal ingot grown in accordance with conventional Czochralski crystal growing methods. Alternatively, however, the segment of single crystal silicon may be obtained from an ingot grown in accordance with conventional Float-zone crystal growing methods. Such methods, as well as standard silicon slicing, lapping, etching, and polishing techniques are disclosed, for example, in F. Shimura, *Semiconductor Silicon Crystal Technology*, Academic Press, 1989, and *Silicon Chemical Etching*, (J. Grabmaier ed.) Springer-Verlag, New York, 1982 (incorporated herein by reference).

It is to be noted that because the process of the present invention proceeds in accordance with the F-T mechanism, interstitial platinum atoms fill vacancies in the silicon matrix upon in-diffusion. Therefore, the platinum concentration profile is a function of, or substantially dependent on, the vacancy concentration profile within the silicon segment. Stated another way, the position assumed by platinum atoms within the silicon matrix correspond to the positions of vacancies within the matrix. Gettering by oxygen precipitants is therefore not believed to be involved in the present process. As a result, the oxygen concentration of the silicon segment is not narrowly critical to the process of the present invention. Accordingly, the starting silicon segment may contain essentially no oxygen, or it may have an oxygen concentration falling anywhere within or even outside the range attainable by the Czochralski process (which typically ranges from about $5 \times 10^{17}$ to about $9 \times 10^{17}$ atoms/cm$^3$, as determined by ASTM standard F-121-83).

For Czochralski grown silicon, depending upon the cooling rate of the single crystal silicon ingot from the temperature of the melting point of silicon (about 1410° C.) through the range of about 750° C. to about 350° C., oxygen precipitate nucleation centers may be formed. The presence or absence of these nucleation centers in the starting material is not critical to the present invention. Preferably, however, these centers are capable of being dissolved by heat-treating the silicon at temperatures not in excess of about 1300° C. Certain heat-treatments, such as annealing the silicon at a temperature of about 800° C. for about four hours, can stabilize these centers such that they are incapable of being dissolved at temperatures not in excess of about 1150° C.

Substitutional carbon, when present as an impurity in single crystal silicon, has the ability to catalyze the formation of oxygen precipitate nucleation centers. For this and other reasons, therefore, it is preferred that the single crystal silicon starting material have a low concentration of carbon. That is, the single crystal silicon preferably has a concentration of carbon which is less than about $5 \times 10^{16}$ atoms/cm$^3$, preferably which is less than $1 \times 10^{16}$ atoms/cm$^3$, and more preferably less than $5 \times 10^{15}$ atoms/cm$^3$.

Referring now to FIG. 5, the starting material for the present invention is preferably a single crystal silicon segment 1 having a front surface 3, a back surface 5, and an imaginary central plane 7 between the front and back surfaces. The terms "front" and "back" in this context are used to distinguish the two major, generally planar surfaces of the segment; the front surface of the segment as that term is used herein is not necessarily the surface onto which an electronic device will subsequently be fabricated nor is the back surface of the segment as that term is used herein necessarily the major surface of the segment which is opposite the surface onto which the electronic device is fabricated. In addition, because silicon segments may have some total thickness variation (TTV), warp and bow, the midpoint between every point on the front surface and every point on the back surface may not precisely fall within a plane; as a practical matter, however, the TTV, warp and bow are typically so slight that to a close approximation the midpoints can be said to fall within an imaginary central plane which is approximately equidistant between the front and back surfaces.

It is to be noted that the process of the present invention may be successfully carried out on silicon segments of varying thicknesses, the thickness of the material being in part a function of the type of device to be fabricated from it. For example, a relatively thin silicon segment, such as a silicon wafer ranging in thickness from about 500 to about 800 microns, may be used as the starting material. Alternatively, thicker segments, ranging in thicknesses from 800 microns up to about 1500 microns or more, may be used. Typically, however, for the particular devices of interest, such as thyristors and power diodes, as well as low noise, high performance silicon detectors, thicknesses will range from about 800 to about 1200 microns.

In a first embodiment of the process of the present invention, segment 1 is heat-treated in an oxygen-containing atmosphere in step $S_1$ to grow a superficial oxide layer 9 which envelopes segment 1. In general, the oxide layer will have a thickness which is greater than the native oxide layer which forms upon silicon (about 15 Ångstroms); preferably, the oxide layer has a thickness of at least about 20 Ångstroms and, in some embodiments, at least about 25 Ångstroms or even at least about 30 Ångstroms. Experimental evidence obtained to-date, however, suggests that oxide layers having a thickness greater than about 30 Ångstroms, while not interfering with the desired effect, provide little or no additional benefit.

In step $S_2$, the wafer is subjected to a heat-treatment step in which the wafers are heated to an elevated temperature to form and thereby increase the number density of crystal lattice vacancies 13 in the bulk 11 of wafer 1. Preferably, this heat-treatment step is carried out in a rapid thermal annealer in which the wafers are rapidly heated to a target temperature and annealed at that temperature for a relatively short period of time. In general, the wafer is subjected to a temperature in excess of 1150° C., preferably at least 1175° C., more preferably at least about 1200° C., and most preferably between about 1200° C. and 1275° C.

In the first embodiment of the present invention, the rapid thermal annealing step is carried out in the presence of a nitriding atmosphere, that is, an atmosphere containing nitrogen gas ($N_2$) or a nitrogen-containing compound gas such as ammonia which is capable of nitriding an exposed silicon surface. The atmosphere may thus consist entirely of nitrogen or nitrogen compound gas, or it may additionally comprise a non-nitriding gas such as argon. An increase in the vacancy concentration throughout the segment is achieved nearly, if not immediately, upon achieving the annealing temperature. The segment will generally be maintained at this temperature for at least one second, typically for at least several seconds (e.g., at least 3), preferably for several tens of seconds (e.g., 20, 30, 40, or 50 seconds) and, depending upon the initial thickness and the desired resulting characteristics of the segment, for a period which may range up to about 60 seconds (which is near the limit for commercially available rapid thermal annealers). The resulting segment will have a relatively uniform vacancy concentration (number density) profile.

Based upon experimental evidence obtained to-date, the atmosphere in which the rapid thermal annealing step is carried out preferably has no more than a relatively small partial pressure of oxygen, water vapor and other oxidizing gases; that is, the atmosphere has a total absence of oxidizing gases or a partial pressure of such gases which is insufficient to inject sufficient quantities of silicon self-interstitial atoms which suppress the build-up of vacancy concentrations. While the lower limit of oxidizing gas concentration has not been precisely determined, it has been demonstrated that for partial pressures of oxygen of 0.01 atmospheres (atm.), or 10,000 parts per million atomic (ppma), no increase in vacancy concentration and no effect is observed. Thus, it is preferred that the atmosphere have a partial pressure of oxygen and other oxidizing gases of less than 0.01 atm. (10,000 ppma); more preferably the partial pressure of these gases in the atmosphere is no more than about 0.005 atm. (5,000 ppma), more preferably no more than about 0.002 atm. (2,000 ppma), and most preferably no more than about 0.001 atm. (1,000 ppma).

The rapid thermal anneal may be carried out in any of a number of commercially available rapid thermal annealing ("RTA") furnaces in which silicon segments may be individually heated by banks of high power lamps. RTA furnaces are generally capable of rapidly heating a silicon segment, having a thickness within the ranges noted above, from room temperature to about 1200° C. in a few seconds. One such commercially available RTA furnace is the model 610 furnace available from AG Associates (Mountain View, Calif.).

Intrinsic point defects (i.e., vacancies and silicon self-interstitials) are capable of diffusing through single crystal silicon, with the rate of diffusion being temperature dependant. The concentration profile of intrinsic point defects at a given temperature, therefore, is a function of the diffusivity of the intrinsic point defects and the recombination rate. For example, intrinsic point defects are relatively mobile at temperatures in the vicinity of the temperature at which the wafer is annealed in the rapid thermal annealing step whereas they are essentially immobile for any commercially practical time period at temperatures of as much as 700° C. Experimental evidence obtained to-date suggests that the effective diffusion rate of vacancies slows considerably at temperatures less than about 700° C., and that perhaps at temperatures as great as 800° C., 900° C., or even 1,000° C., the vacancies can be considered to be immobile for any commercially practical time period.

Upon completion of step $S_2$, the wafer is rapidly cooled in step $S_3$ through the range of temperatures at which crystal lattice vacancies are relatively mobile in the single crystal silicon. As the temperature of the segment is decreased through this range of temperatures, the vacancies diffuse to the oxide layer 9 and become annihilated, thus leading to a change in the vacancy concentration profile with the extent of change depending upon the length of time the segment is maintained at a temperature within this range. If the segment were held at this temperature within this range for an infinite period of time, the vacancy concentration would once again become substantially uniform throughout the bulk 11, with the concentration being an equilibrium value which is substantially less than the concentration of crystal lattice vacancies immediately upon completion of the heat treatment step. By rapidly cooling the segment, however, a non-uniform distribution of crystal lattice vacancies can be achieved, with the maximum vacancy concentration being at or near central plane 7 and the vacancy concentration decreasing in the direction of the front surface 3 and back surface 5 of the segment.

In general, the average cooling rate within this range of temperatures is at least about 5° C. per second and preferably at least about 20° C. to about 30° C. per second, or more. Depending upon the desired depth of the low vacancy concentration region near the surface, the average cooling rate may preferably be at least about 50° C. per second, still more preferably at least about 100° C. per second, with cooling rates in the range of about 100° C. to about 200° C. per second being presently preferred for some applications. Once the segment is cooled to a temperature outside the range of temperatures at which crystal lattice vacancies are relatively mobile in the single crystal silicon, the cooling rate does not appear to significantly influence the vacancy concentration profile of the segment and, thus, does not appear to be narrowly critical. Conveniently, the cooling step may be carried out in the same atmosphere in which the heating step is carried out.

In step $S_4$, platinum atoms are diffused into crystal lattice vacancies. In general, platinum is deposited on the surface of the silicon segment and diffused in a horizontal surface by heating the segment for a specified period of time. The diffusion time and temperature are preferably selected such that the Frank-Turnbull mechanism dominates platinum diffusion. Furthermore, the diffusion time and temperature are preferably sufficient to allow for the vacancy decoration by platinum atoms to reach steady-state.

For silicon segments having vacancy concentrations which are typical for the present invention, the diffusion temperature typically ranges from about 650 to about 850° C. Preferably, however, the temperature ranges from about 670 to about 750° C. More preferably, the temperature ranges from about 680 to about 720° C. Diffusion time typically ranges from about 2 minutes to about 4 hours. Preferably, however, the time ranges from about 10 minutes to about 2 hours. More preferably, the time ranges from about 15 minutes to about 30 minutes.

Preferably, thermal diffusion of platinum is performed under an atmosphere comprising nitrogen or an inert gas, or mixtures thereof. An oxygen-containing atmosphere may also be employed, given the low temperatures employed by the present process. However, it is to be noted that generally this thermal diffusion step may be performed under any atmosphere which, given the low temperatures employed, does not result in the injection of point defects into the silicon segment matrix.

It is to be noted, however, that the precise time and temperature needed for the diffusion process in order for platinum atoms to fully react with, or fill, vacancies present in the silicon segment may vary, at least in part, as a function of the thickness of the sample and the number of vacancies which are present. As a result, the optimum time and temperature may be determined empirically. For example, a silicon segment may be divided into several portions and, after depositing the same concentration of platinum onto each, heat treating each portion using different time and temperature combinations.

Silicidation of the sample surface is preferably avoided because silicidation may result in the injection of point defects. Mechanical strain may also originate from the silicide layer, which may have a non-negligible influence on platinum diffusion. Additionally, silicidation of the sample surface may have an undesirable influence on platinum detection or measurement techniques. Accordingly, to minimize the potentially negative influence of the silicidation process, the platinum deposition method preferably results in a surface concentration of less than one monolayer, wherein a platinum monolayer corresponds to a surface area concentration of about $2\times10^{15}$ atom/cm$^2$. Stated another way, it is preferred that a quantity of platinum be deposited onto the silicon segment surface such that the resulting surface concentration does not exceed about $2\times10^5$ atoms/cm$^2$.

Platinum deposition may be achieved by essentially any method common in the art, provided such methods do not result in the deposition of a quantity of platinum onto the surface of the silicon segment which may result in the creation of surface defects and the injection of point defects into the bulk of the segment. For example, sputtering or e-gun evaporation techniques may be used to deposit fractions of a monolayer onto the surface of the segment. Alternatively, an acidified platinum solution, having a platinum concentration of about 1 gram/liter for example, may be deposited onto the surface by spin coating or immersing the segment into the solution, preferably after the surface of the segment has been treated with a solution of HCl:H$_2$O$_2$:H$_2$O (1:1:6) at about 80° C. for about 10 minutes.

After the in-diffusion heat treatment of step $S_4$ is complete, the depth profile, or concentration profile, of the platinum in the silicon segment may be determined using means common in the art, such as through the use of deep level transient spectroscopy (DLTS) measurements. In one embodiment of the DLTS measurements, silicon segments samples are cut into pieces of about 1 cm$^2$, beveled with angles of 1.17° and 2.86°, and polished. A layer of silicon about 15 microns in thickness is then etched from a surface using a etch solution comprising a 2:1:1 ratio of HF (hydrofluoric acid, 50% solution) to HNO$_3$ (nitric acid, fuming) to CH$_3$CO$_2$H (acetic acid, glacial). Schottky contacts are deposited by evaporation of hafnium. For ohmic contacts at the backside, gallium is used. The detection ranged of substitutional platinum concentration $C_s$ depends on the dopant concentration $D_d$, the relationship between these may be expressed as $C_d\times10^{-4}<C_s<C_d\times10^{-1}$.

Platinum diffusion techniques, as well as platinum detection methods, are further described elsewhere. See, for example, articles by Jacob et al., *J. Appl. Phys.*, vol. 82, p. 182 (1997); Zimmermann and Ryssel, "The Modeling of Platinum Diffusion In Silicon Under Non-Equilibrium Conditions," *J. Electrochemical Society*, vol. 139, p. 256 (1992); Zimmermann, Goesele, Seilenthal and Eichiner, "Vacancy Concentration Wafer Mapping In Silicon," *Journal of Crystal Growth*, vol. 129, p. 582 (1993); Zimmermann and Falster, "Investigation Of The Nucleation of Oxygen Precipitates in Czochralski Silicon At An Early Stage," *Appl. Phys. Lett.*, vol. 60, p. 3250 (1992); and, Zimmermann and Ryssel, *Appl. Phys. A*, vol. 55, p. 121 (1992).

As a result of the first embodiment of the present process, high vacancy regions located within the bulk of the silicon segment are formed and are subsequently decorated or filled by platinum atoms, which are diffused into the silicon segment in accordance with the F-T mechanism. As illustrated by FIG. 5, the resulting silicon segment is characterized by a region 17 which contains a peak platinum concentration, the concentration being substantially uniform. In addition, the silicon segment contains regions 15 and 15' which extend from the front surface 3 and back surface 5, respectively, to a depth t and t'. As compared to region 17 of the silicon segment, regions 15 and 15' contain a relatively lower concentration of platinum (not shown) and, as a result, possess longer minority carrier recombination lifetimes than region 17. Platinum concentrations within these surface layers or regions may range from a low concentration of less than about $1\times10^{11}$ atoms/cm$^2$, up to about $1\times10^{12}$ atoms/cm$^2$, about $1\times10^{13}$ atoms/cm$^2$, or even a peak concentration of about $5\times10^{13}$ (excluding the surfaces of the segment). By dividing the silicon segment into various zones or regions by means of tailoring or controlling the vacancy concentration profile, a template is effectively created through which is written a pattern or profile for the resulting platinum concentration, after in-diffusion is complete.

It is to be noted that, due to interactions that may occur on the silicon segment surfaces between platinum and intrinsic point defects that may be present, references to regions of peak concentration and, comparatively, of lower concentrations are intended to exclude the silicon surfaces. Stated another way, the silicon segment surfaces are not to be considered when determining or evaluating the concentration profile of recombination centers, or when making any comparisons based thereon.

In accordance with the process of the present invention, the concentration of minority carrier recombination centers in region 17 is primarily a function of the concentration of vacancies which are present, which in turn is a function of the heating step ($S_2$) and secondarily a function of the cooling rate ($S_3$). Likewise, the depth t, t' from the front and back surfaces, respectively, of the regions 15 and 15' is also a function of the vacancy concentration, which in turn is primarily a function of the cooling rate through the temperature range at which crystal lattice vacancies are relatively mobile in silicon. Accordingly, given that the depth t, t' increases with decreasing cooling rates, the cooling rate may be controlled such that depths of at least about 10, 20, 30, 40, 50, 70 or even 100 microns are attainable.

In a second embodiment of the present invention, a neutral (i.e., a non-nitriding, non-oxidizing) atmosphere is used in the heating (rapid thermal annealing) and cooling steps, in place of the nitriding atmosphere of the first embodiment. Suitable neutral atmospheres include argon, helium, neon, carbon dioxide, and other such non-oxidizing, non-nitriding elemental and compound gases, or mixtures of such gases. The neutral atmosphere, like the nitriding atmosphere, may contain a relatively small partial pressure of oxygen, i.e., a partial pressure less than 0.01 atm. (10,000 ppma), more preferably less than 0.005 atm. (5,000 ppma), more preferably less than 0.002 atm. (2,000 ppma), and most preferably less than 0.001 atm. (1,000 ppma).

In a third embodiment of the present invention, step $S_1$ (the thermal oxidation step) is omitted and the starting silicon segment has no more than a native oxide layer. Referring now to FIG. 6A, when such a segment is annealed under a neutral atmosphere, as discussed in reference to the second embodiment above, generally results similar to those of embodiments 1 and 2 are obtained. However, when such a segment is annealed in a nitriding atmosphere, such as that of the first embodiment, the effect differs from that which is observed when a segment having an oxide layer which is greater in thickness than a native oxide layer (i.e., an "enhanced oxide layer") is annealed in nitrogen atmosphere.

Figure 7:
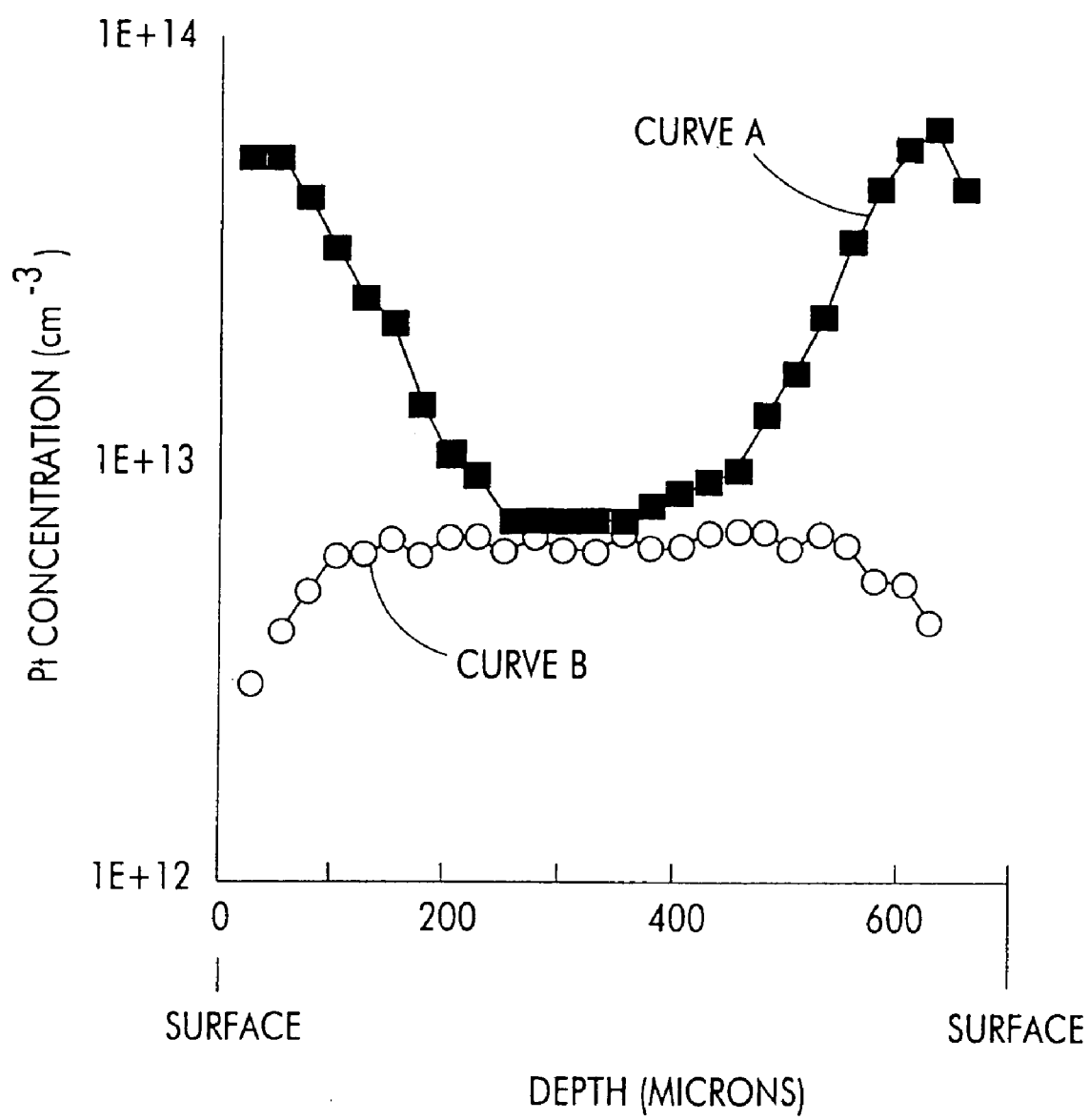
FIG. 7 is a plot of the platinum concentration versus the depth of the silicon segment (extending from one surface to the other, but excluding the surfaces themselves), showing in detail the difference profiles which may be obtained if an enhanced oxide layer is present (curve B) or only a native oxide layer is present (curve A) during the thermal annealing treatment.

When the segment containing an enhanced oxide layer is annealed in a nitrogen atmosphere (FIG. 6A), a substantially uniform increase in the vacancy concentration is achieved throughout the segment nearly, if not immediately, upon reaching the annealing temperature; furthermore, the vacancy concentration does not appear to significantly increase as a function of annealing time at a given annealing temperature. In contrast, as can be seen from FIG. 6B, if the segment has nothing more than a native oxide layer on the surface and if the front and back surfaces of the segment are annealed in nitrogen, the resulting segment will have a vacancy concentration (number density) profile which is generally "U-shaped" for a cross-section of the segment. As illustrated by FIG. 6B and FIG. 7 (curve A), this profile may subsequently be modified as the segment cools down, taking on a generally "M-shaped" form, due to vacancy transport in the near surface region to the surface itself, which acts as a sink for these intrinsic point defects. More specifically, a maximum vacancy concentration will occur at or within several microns or tens of microns from the front and back surfaces and a relatively constant and lesser concentration will occur throughout the bulk, with the minimum concentration in the bulk initially being approximately equal to the concentration which is obtained in silicon segments having an enhanced oxide layer, after having been treated in accordance with the present process (denoted as curve B in FIG. 7). Furthermore, an increase in annealing time will result in an increase in vacancy concentration in silicon segments lacking anything more than a native oxide layer.

Accordingly, referring again to FIG. 5, when a segment having only a native oxide layer is annealed in accordance with the present process under a nitriding atmosphere, the resulting peak concentration of minority carrier recombination centers, after platinum diffusion, will initially be located generally within regions 15 and 15', while the bulk 17 of the silicon segment will contain a comparatively lower concentration of recombination centers. Typically, these regions of peak concentration will be located within several microns (i.e., about 5 or 10 microns), or tens of microns (i.e., about 20 or 30 microns), up to about 40 to about 60 microns, from the silicon segment surface.

Experimental evidence further suggests that this difference in behavior for silicon segments having no more than a native oxide layer and those having an enhanced oxide layer can be avoided by including molecular oxygen or another oxidizing gas in the atmosphere. Stated another way, when silicon segments having no more than a native oxide layer are annealed in a nitrogen atmosphere, it is preferred that the atmosphere additionally containing a small partial pressure of oxygen. Such atmospheric conditions result in segments having only a native oxide layer behaving the same as segments which have an enhanced oxide layer. Without being bound to any particular theory, it appears that superficial oxide layers which are greater in thickness than a native oxide layer serve as a shield which inhibits nitridization of the silicon. Nitridization is believed to result in the formation of vacancies in, or the injection of vacancies into, the silicon matrix. As a result, as may be seen by comparing FIGS. 6A and 6B, the peak concentration of vacancies (and thus recombination centers also) is actually greater than the peak that might otherwise be observed, if vacancies where not injected.

The oxide layer may therefore be present on the starting silicon segment or formed in situ, by growing an enhanced oxide layer during the annealing step. If the latter approach is taken, the atmosphere during the rapid thermal annealing step preferably contains a partial pressure of at least about 0.0001 atm. (100 ppma), and more preferably a partial pressure of at least about 0.0002 atm. (200 ppma). Referring again to FIG. 6A, in this way results similar to those of the first and second embodiments of the present invention may be obtained. However, for the reasons previously discussed, the partial pressure of oxygen preferably does not exceed 0.01 atm. (10,000 ppma), with partial pressures of less than 0.005 atm. (5,000 ppma), 0.002 atm. (2,000 ppma), and even 0.001 atm. (1,000 ppma) being more preferred.

However, it is to be noted that as an alternative to utilizing an atmosphere having a partial pressure of oxygen, the silicon segment may simply be annealed under an oxygen atmosphere after annealing under a nitrogen atmosphere or a neutral atmosphere, as described in the above embodiments, is complete. The oxygen annealing step may be performed after the segment has been allowed to cool or, alternatively, may be performed at temperature (i.e., while the segment is still hot after the initial thermal anneal step has been completed). Furthermore, this oxygen anneal step may optionally be performed for any of the above-described embodiments as a means by which to further tailor or profile the vacancy concentration within the silicon segment and, as such, the resulting platinum concentration.

Without being held to any particular theory, it is believed that oxygen annealing results in the oxidation of the silicon surface and, as a result, acts to create an inward flux of silicon self-interstitials. This inward flux of self-interstitials has the effect of gradually altering the vacancy concentration profile by causing recombinations to occur, beginning at the surface and then moving inward. A region of low vacancy concentration may therefore be created having a depth which may be optimized for the particular end use of the device which is to be fabricated from the silicon segment. Referring now to FIGS. 6C and 6D, it may be seen that, depending upon the conditions which were utilized prior to the oxygen anneal step, a number of different platinum concentration profiles may ultimately be obtained (where curves A through E, respectively, schematically represent different profiles obtained under different oxygen anneal conditions of the present invention). More specifically, curves A through E of FIGS. 6C and 6D illustrate the resulting platinum concentration profiles which may be obtained as a result of conducting the oxygen anneal step to alter the vacancy concentration profile, prior to platinum in-diffusion.

Referring to FIG. 6D, for a silicon segment having a peak concentration of vacancies near the front and back surfaces, it is to be noted that after platinum in-diffusion a segment may be obtained in which the distribution of recombination centers is non-uniform. More specifically, this segment contains a non-uniform distribution of recombination centers wherein the maximum concentration is in a region which is between the front surface and the central plane and nearer to the front surface than the central plane, with the concentration of the nucleation centers increasing from the front surface to the region of maximum concentration and decreasing from the region of maximum concentration to the central plane.

For silicon segments having the peak concentration of vacancies within the bulk 17 of the silicon segment, the depth t and t' of regions 15 and 15', respectively, may be selectively increased by controlling the rate at which oxidation of the surfaces occurs. The rate of oxidation is in turn dependent upon a number of factors, such as the atmospheric conditions, temperature and duration of this oxidation step. For example, the rate of oxidation will increase as the concentration of oxygen in the atmosphere increases, with the rate being greatest when pyrogenic steam is employed.

It is to be noted that the precise conditions for the oxidative treatment may be empirically determined by adjusting the temperature, duration and atmospheric composition in order to optimize the depth t and/or t'. However, if something other than pure oxygen or pyrogenic steam is employed in the present process, preferably the partial pressure of oxygen in the atmosphere will be at least about 0.0001 (100 ppma), and more preferably at least about 0.0002 (200 ppma). In this regard it is to be noted that the limitations placed upon the oxygen content, or partial pressure, for the thermal anneal step $S_2$ are not applicable for this optional step of the process. Furthermore, if the peak concentration of vacancies, and thus minority carrier recombination centers, for region 17 (or regions 15 and 15') is to be substantially retained, the temperature of this oxidative treatment is preferably in excess of about 1150° C. More preferably, the temperature is at least about equal to the temperature employed during the thermal treatment of step $S_2$. Without being held to any particular theory, it is believe that if the temperature is less than that employed during the thermal treatment, the peak concentration of recombination centers in region 17 may actually decrease because of the direct recombination of vacancies and self-interstitials.

This separate oxidative treatment approach is an acceptable alternative to controlling the vacancy concentration profile, and accordingly the platinum concentration profile, by means of adjusting the rate of cooling, as described in detail above. It may be preferred in some situations because of the additional flexibility it provides. In addition, this approach is preferred when the depth of t or t' is in excess of tens of microns, or several tens of microns. Furthermore, subsequent oxidative treatment of the silicon segment, prepare by any of the above-described embodiments of the present invention, provides the means by which to prepare a silicon segment containing a number different minority carrier recombination center concentration profiles, as schematically illustrated in FIGS. 6C and 6D.

In other embodiments of the present invention, the front and back surfaces of the segment may be exposed to different atmospheres, each of which may contain one or more nitriding or non-nitriding gases. For example, the back surface of the silicon segment may be exposed to a nitriding atmosphere as the front surface is exposed to a non-nitriding atmosphere. In addition, one of the surfaces may be shielded during treatment. For example, referring now to FIGS. 8A through 8F, after the vacancy concentration profile has been established throughout the silicon segment, one surface may be shielded while the other is thermal annealed in an oxygen atmosphere, as noted above. Shielding may be achieved, for example, by simultaneously annealing multiple segments (e.g., 2, 3 or more) while being stacked in face-to-face arrangement; when annealed in this manner, the faces which are in face-to-face contact are mechanically shielded from the atmosphere during the annealing. Alternatively, a similar effect may be achieved (depending upon the atmosphere employed during the rapid thermal annealing step and the desired platinum concentration profile of the segment) by forming an oxide layer only upon the side of the segment at which platinum in-diffusion is desired. Shielding one of the surface of a silicon segment, prepared in accordance with the present invention, in this way may ultimately yield a segment which contains an asymmetric recombination center concentration profile, as the examples in FIGS. 8A through 8F illustrate. More specifically, FIGS. 8A and 8F illustrate examples of the resulting platinum concentration profiles which may be obtained as a result of conducting the oxygen anneal step to alter the vacancy concentration profile in this way, prior to platinum in-diffusion.

It is to be noted that, in order for the desired recombination center concentration profile to be present in the device ultimately fabricated from the silicon segment, the present process will typically be incorporated into the device fabrication process at a point which is appropriately suitable for the objectives of the present invention to be achieved. Furthermore, the platinum in-diffusion step of the present process is preferably performed immediately following the rapid thermal anneal and subsequent cool down steps, $S_2$ and $S_3$. More specifically, it is preferred that the steps of the present process be performed in sequential order, without any intervening treatments. However, if intervening treatments are necessary as part of the device fabrication process, it is preferred that such treatments be for only short periods of time and at low temperatures. More specifically, it is preferred that any intervening treatment be performed at a temperature less than about 1000° C. for a duration which is not sufficient to result in an appreciable change in the vacancy concentration profile, or recombination center profile, which has previously been established in the silicon segment as a results of the present process.

The starting material for the process of the present invention may be a polished silicon segment, such as a silicon wafer, or alternatively, a silicon segment which has been lapped and etched but not polished. In addition, the segment may have vacancy or self-interstitial point defects as the predominant intrinsic point defect. For example, the segment may be vacancy dominated from center to edge, self-interstitial dominated from center to edge, or it may contain a central core of vacancy dominated material surrounded by an axially symmetric ring of self-interstitial dominated material.

In view of the above, it will be seen that the several objects of the invention are achieved.

As various changes could be made in the above compositions and processes without departing from the scope of the invention, it is intended that all matter contained in the above description be interpreted as illustrative and not in a limiting sense.

We claim:

1. An electronic power device comprising:
    a single crystal silicon segment having two major, generally parallel surfaces, a front surface of the segment and a back surface of the segment, a central plane between the front and back surfaces, a circumferential edge joining the front and back surfaces, a surface layer which comprises a first region of the segment below the front surface and a distance, $D_1$, as measured from the front surface and toward the central plane, and a bulk layer which comprises a second region of the segment between the central plane and the first region, the electronic power device being characterized in that
    the single crystal silicon segment comprises a non-uniform distribution of minority carrier recombination centers, the minority carrier recombination centers comprising a substitutional metal, with the concentration of the centers in the bulk layer being greater than the concentration in the surface layer and with the centers having a concentration profile in which the peak density of the centers is at or near the central plane with the concentration generally decreasing from the position of peak density in the direction of the front surface of the segment and with the concentration generally decreasing from the position of peak density in the direction of the back surface of the segment.

2. The electronic power device of claim 1 wherein the device is a thyristor.

3. The electronic power device of claim 1 wherein the device is a power diode.

4. The electronic power device of claim 1 wherein the segment has a carbon concentration which is less than about $1 \times 10^{16}$ atoms/cm$^3$.

5. The electronic power device of claim 1 wherein the segment has a thickness ranging from about 500 microns to about 800 microns.

6. The electronic power device of claim 1 wherein the segment has a thickness ranging from about 800 microns to about 1200 microns.

7. The electronic power device of claim 1 wherein the concentration of minority carrier recombination centers in the segment's surface layer is less than about $1\times10^{11}$ centers/cm$^3$.

8. The electronic power device of claim 1 wherein the concentration of minority carrier recombination centers in the segment's surface layer is less than about $1\times10^{13}$ centers/cm$^3$.

9. The electronic power device of claim 1 wherein the distance $D_1$ is at least about 10 microns.

10. The electronic power device of claim 1 wherein the distance $D_1$ is at least about 30 microns.

11. The electronic power device of claim 1 wherein the distance $D_1$ is at least about 50 microns.

12. The electronic power device of claim 1 wherein the distance $D_1$ is at least about 100 microns.

13. An electronic power device comprising:
a single crystal silicon segment having two major, generally parallel surfaces, a front surface of the segment and a back surface of the segment, a central plane between the front and back surfaces, the electronic power device being characterized in that
single crystal silicon segment comprises a non-uniform distribution of minority carrier recombination centers, the minority carrier recombination centers comprising a substitutional metal, and with a maximum concentration of the minority carrier recombination centers being in a region which is between the front surface and the central plane and nearer to the front surface than the central plane and with a minimum concentration of the recombination centers, which is less than the concentration of the recombination centers at the central plane and which is between the front surface and the maximum concentration, the concentration of the recombination centers increasing from the minimum concentration to the maximum concentration and decreasing from the maximum concentration to the central plane.

14. The electronic power device of claim 13 wherein the device is a thyristor.

15. The electronic power device of claim 13 wherein the device is a power diode.

16. The electronic power device of claim 13 wherein the segment has a carbon concentration which is less than about $1\times10^{16}$ atoms/cm$^3$.

17. The electronic power device of claim 13 wherein the segment has a thickness ranging from about 500 microns to about 800 microns.

18. The electronic power device of claim 13 wherein the segment has a thickness ranging from about 800 microns to about 1200 microns.

19. The electronic power device of claim 13 wherein the segment's maximum concentration of recombination centers is within about 5 microns from the front surface of the segment.

20. The electronic power device of claim 13 wherein the segment's maximum concentration of recombination centers is within about 10 microns from the front surface of the segment.

21. The electronic power device of claim 13 wherein the segment's maximum concentration of recombination centers is within about 20 microns from the front surface of the segment.

22. The electronic power device of claim 13 wherein the segment's maximum concentration of recombination centers is within about 60 microns from the front surface of the segment.

* * * * *